United States Patent
Naha et al.

(10) Patent No.: US 11,402,433 B2
(45) Date of Patent: Aug. 2, 2022

(54) METHOD AND SYSTEM FOR DETERMINING HEALTH PARAMETER OF A BATTERY

(71) Applicant: SAMSUNG ELECTRONICS CO., LTD., Suwon-si (KR)

(72) Inventors: Arunava Naha, Bangalore (IN); Ashish Khandelwal, Bangalore (IN); Krishnan S Hariharan, Bangalore (IN); Seongho Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 17/004,407

(22) Filed: Aug. 27, 2020

(65) Prior Publication Data
US 2021/0063490 A1 Mar. 4, 2021

(30) Foreign Application Priority Data
Aug. 27, 2019 (IN) .............................. 201941034539

(51) Int. Cl.
*G01R 31/367* (2019.01)
*G01R 31/374* (2019.01)
(Continued)

(52) U.S. Cl.
CPC ......... *G01R 31/367* (2019.01); *G01R 31/374* (2019.01); *G01R 31/382* (2019.01);
(Continued)

(58) Field of Classification Search
CPC .. G01R 31/367; G01R 31/374; G01R 31/382; G01R 31/389; G01R 31/392; G01R 31/3648
See application file for complete search history.

(56) References Cited

U.S. PATENT DOCUMENTS 6,876,174 B1 * 4/2005 Samittier Marti ... G01R 31/389
320/132
8,332,169 B2 12/2012 Kang et al.
(Continued)

FOREIGN PATENT DOCUMENTS

CN 102968573 A 3/2013
CN 107436411 A 12/2017
(Continued)

OTHER PUBLICATIONS

Li et al., "Study and Realization on the Internal Impedance of Single Cell On-line Detector" Proceedings of the IEEE International Conference on Automation and Logistics Qingdao, China Sep. 2008 (Year: 2008).*

(Continued)

*Primary Examiner* — John C Kuan
(74) *Attorney, Agent, or Firm* — Sughrue Mion, PLLC

(57) ABSTRACT

Provided are a method and system for determining State of Health (SOH) of a battery. The method includes: detecting a charging state of the battery that is being charged by a Constant Current (CC) or a Constant Voltage (CV); adding a low frequency current signal to the CC that is charging the battery to obtain a low frequency charging current, or adding a low frequency voltage signal to the CV, that is charging the battery to obtain a low frequency charging voltage; determining one or more parameters relating to the battery during the charging state of the battery; calculating an internal impedance and Open Circuit Voltage (OCV) values based on the one or more parameters; and determining SOH of the battery based on the calculated internal impedance and the OCV values.

17 Claims, 7 Drawing Sheets

(51) Int. Cl.
*G01R 31/382* (2019.01)
*G01R 31/389* (2019.01)
*G01R 31/392* (2019.01)
*G01R 31/36* (2020.01)
*G06N 20/00* (2019.01)

(52) U.S. Cl.
CPC ......... *G01R 31/389* (2019.01); *G01R 31/392* (2019.01); *G06N 20/00* (2019.01); *G01R 31/3648* (2013.01)

(56) References Cited

U.S. PATENT DOCUMENTS

| | | | |
|---|---|---|---|
| 2003/0204328 A1* | 10/2003 | Tinnemeyer | G01R 31/382 702/30 |
| 2006/0170397 A1* | 8/2006 | Srinivasan | G01R 31/3842 320/132 |
| 2007/0046261 A1* | 3/2007 | Porebski | G01R 31/3865 320/132 |
| 2008/0204031 A1 | 8/2008 | Iwane et al. | |
| 2010/0156356 A1 | 6/2010 | Asakura et al. | |
| 2013/0307488 A1 | 11/2013 | Hwang | |
| 2015/0127425 A1 | 5/2015 | Greene et al. | |
| 2015/0153418 A1 | 6/2015 | Prenninger et al. | |
| 2015/0303533 A1* | 10/2015 | Osaka | G01R 31/374 429/90 |
| 2016/0139207 A1* | 5/2016 | Sano | G01R 31/3842 702/63 |
| 2017/0331162 A1* | 11/2017 | Clarke | H02J 7/005 |
| 2017/0373354 A1 | 12/2017 | Huang et al. | |
| 2019/0113577 A1 | 4/2019 | Severson et al. | |
| 2019/0120908 A1 | 4/2019 | Naha et al. | |
| 2020/0363476 A1* | 11/2020 | Liu | G01R 31/389 |

FOREIGN PATENT DOCUMENTS

| | | |
|---|---|---|
| EP | 1933158 A1 | 6/2008 |
| IN | 201741037852 A | 4/2019 |
| JP | 11204147 A * | 7/1999 |
| KR | 1020130127792 A | 11/2013 |
| KR | 20140084910 A * | 7/2014 |
| WO | 2017207891 A1 | 12/2017 |

OTHER PUBLICATIONS

Huet, "A review of impedance measurements for determination of the state-of-charge or state-of-health of secondary batteries" Journal of Power Sources 70 (1998) 59-69 (Year: 1998).*

Huang et al., "An Online Battery Impedance Measurement Method Using DC-DC Power Converter Control" IEEE Transactions on Industrial Electronics, vol. 61, No. 11, Nov. 2014 (Year: 2014).*

International Search Report (PCT/ISA/210) dated May 26, 2020 issued by the International Searching Authority in International Application No. PCT/KR2019/016447.

* cited by examiner

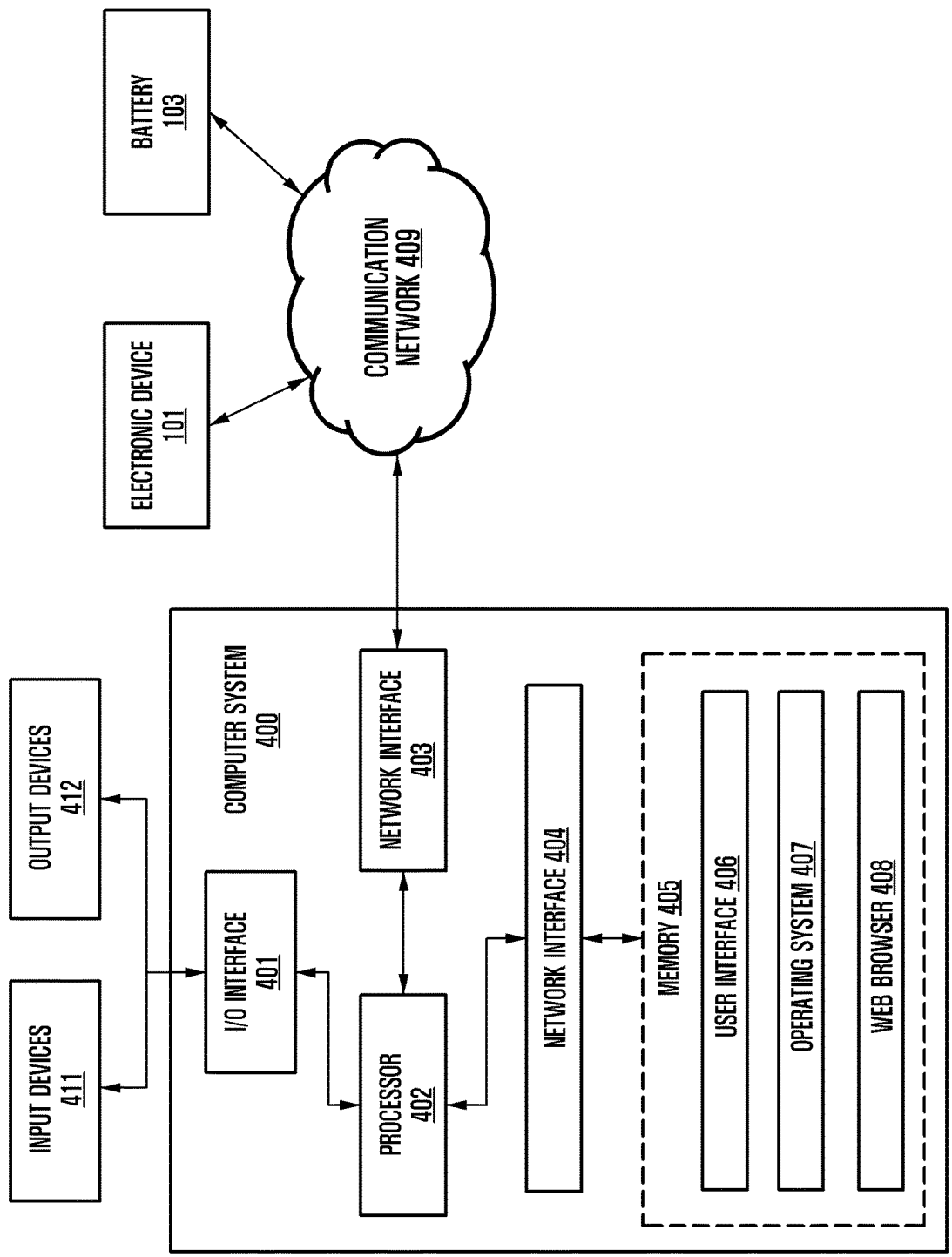

METHOD AND SYSTEM FOR DETERMINING HEALTH PARAMETER OF A BATTERY

CROSS-REFERENCE TO RELATED APPLICATION(S)

This application is based on and claims priority under 35 U.S.C. § 119 to Indian Patent Application No. 201941034539, filed on Aug. 27, 2019, in the Indian Intellectual Property Office, the disclosure of which is incorporated by reference herein in its entirety.

1. Field

The disclosure relates to rechargeable batteries, and more particularly, to a method and a system for determining a health parameter of a battery.

2. Description of Related Art

Generally, health of rechargeable batteries deteriorates over a period of time. However, the period of time may vary for different rechargeable batteries based on factors such as charging pattern, type of chargers, current fluctuations, lifetime of the battery and the like. As the health deteriorates, charge storing capacity of the battery may decrease compared to the initial charge storing capacity. When health of the battery falls below 80%, then the battery may become unreliable and unsafe for use. This may also affect lifetime of a device in which the battery is being used. Therefore, accurate estimation of State of Health (SOH) of the battery is very crucial for understanding factors such as, remaining useful life of the battery, reliability of the battery and the like. Further, the estimated SOH helps in planning battery replacement at the right time for devices such as smartphones, Electronic Vehicles (EVs) and the like. Further, SOH may also be used for detecting internal short circuit conditions occurring in the battery. However, the existing systems do not provide an accurate estimation of the SOH of the battery when the battery is in use in the device, which may lead to scenarios such as usage of the battery even after it has reached an unreliable and unsafe state, or replacing the battery during the reliable and safe state of the battery.

A few of the related art techniques determine SOH of the battery based on State of Charge (SOC) of the battery. SOC of the battery is generally an amount of charge remaining in the battery to use at a given point. The SOC based techniques to determine SOH may not be accurate since these techniques may introduce errors that occur due to choice of initial SOC. a few other related art techniques may perform SOH estimation by monitoring the battery until it is completely charged or completely discharged. Monitoring until the batteries are completely charged or discharged to determine the SOH may consume more time and resources. Further, in practical scenarios where most of the time the batteries may be either partially charged or discharged, and in some devices like smartphones, charging and discharging cycles may not even have resting period, related art techniques may fail or provide erroneous results. Furthermore, the related art techniques may not be compatible with different computational capabilities since the batteries may be used in small devices such as smartphones to large devices such as EVs and Aircrafts.

SUMMARY

Provided are a method and apparatus for determining a health parameter of a battery.

Additional aspects will be set forth in part in the description which follows and, in part, will be apparent from the description, or may be learned by practice of the presented embodiments.

In accordance with an aspect of the disclosure, a method of determining a State of Health (SOH) of a battery includes: a method for determining State of Health (SOH) of a battery includes: detecting a charging state of the battery that is being charged by a Constant Current (CC) or a Constant Voltage (CV); adding a low frequency current signal to the CC that is charging the battery to obtain a low frequency charging current, or adding a low frequency voltage signal to the CV, that is charging the battery to obtain a low frequency charging voltage; determining one or more parameters relating to the battery during the charging state of the battery; calculating an internal impedance and Open Circuit Voltage (OCV) values based on the one or more parameters; and determining SOH of the battery based on the calculated internal impedance and the OCV values.

The calculating the internal impedance and the OCV values may include: determining a spectral magnitude and a phase of the low frequency charging current or the low frequency charging voltage by performing a frequency domain estimation; and calculating the internal impedance and the OCV values based on the spectral magnitude and the phase of the low frequency charging current or the low frequency charging voltage.

The determining the SOH of the battery may include: performing a coulomb count for collecting the OCV values at a plurality of time instances where the coulomb count increases by a predefined value, wherein the coulomb count starts from an initial OCV value, for the plurality of time instances; determining a delta OCV vector by computing a difference of each of the OCV values with the initial OCV value, and an average temperature corresponding to the OCV values; and determining the SOH of the battery based on the delta OCV vector and the average temperature using a machine learning model that is pre-trained using trial values.

The one or more parameters may include at least one of current, voltage or temperature related to the battery.

The charging state of the battery may be at least one of a partial charge or a full charge.

The low frequency current signal or the low frequency voltage signal may have a frequency in a range of 1 hertz to 10 hertz.

The low frequency current signal or the low frequency voltage signal may be a square wave including positive values.

In accordance with another aspect of the disclosure, a battery health determining system for determining State of Health (SOH) of a battery includes: a processor; and a memory communicatively coupled to the processor, wherein the memory stores processor-executable instructions that, when executed by the processor, causes the processor to: detect a charging state of the battery that is being charged by a Constant Current (CC) or a Constant Voltage (CV); add a low frequency current signal to the CC that is charging the battery to obtain a low frequency charging current, or add a low frequency voltage signal to the CV charging the battery to obtain a low frequency charging voltage; determine one or more parameters relating to the battery during the charging state of the battery; calculate an internal impedance and Open Circuit Voltage (OCV) values based on the one or more parameters; and determine SOH of the battery based on the calculated internal impedance and the OCV values.

The processor-executable instructions, when executed by the processor, may further cause the processor to: determine a spectral magnitude and a phase of the low frequency charging current or the low frequency charging voltage by performing a frequency domain estimation; and calculate the internal impedance and the OCV values based on the spectral magnitude and the phase of the low frequency charging current or the low frequency charging voltage.

The processor-executable instructions, when executed by the processor, may further cause the processor to: perform a coulomb count for collecting the OCV values at a plurality of time instances where the coulomb count increases by a predefined value, wherein the coulomb count starts from the initial OCV value, for the plurality of time instances; determine a delta OCV vector by computing a difference of each of the OCV values with the initial OCV value, and an average temperature corresponding to the OCV values; and determine the SOH of the battery based on the delta OCV vector and the average temperature using a machine learning model that is pre-trained using trial values.

The one or more parameters may include at least one of current, voltage or temperature related to the battery.

[0018] The charging state of the battery may be at least one of a partial charge or a full charge. [0019] The low frequency current signal or the low frequency voltage signal may have a frequency in a range of 1 hertz to 10 hertz.

The low frequency current signal or the low frequency voltage signal may be a square wave including positive values.

In accordance with another aspect of the disclosure, a non-transitory computer-readable recording medium has recorded thereon instructions executable by a processor to perform a method for determining State of Health (SOH) of a battery, the method including: detecting a charging state of the battery that is being charged by a Constant Current (CC) or a Constant Voltage (CV); adding a low frequency current signal to the CC that is charging the battery to obtain a low frequency charging current, or adding a low frequency voltage signal to the CV, that is charging the battery to obtain a low frequency charging voltage; determining one or more parameters relating to the battery during the charging state of the battery; calculating an internal impedance and Open Circuit Voltage (OCV) values based on the one or more parameters; and determining SOH of the battery based on the calculated internal impedance and the OCV values.

The calculating the internal impedance and the OCV values may include: determining a spectral magnitude and a phase of the low frequency charging current or the low frequency charging voltage by performing a frequency domain estimation; and calculating the internal impedance and the OCV values based on the spectral magnitude and the phase of the low frequency charging current or the low frequency charging voltage.

The determining the SOH of the battery may include: performing a coulomb count for collecting the OCV values at a plurality of time instances where the coulomb count increases by a predefined value, wherein the coulomb count starts from an initial OCV value, for the plurality of time instances; determining a delta OCV vector by computing a difference of each of the OCV values with the initial OCV value, and an average temperature corresponding to the OCV values; and determining the SOH of the battery based on the delta OCV vector and the average temperature using a machine learning model that is pre-trained using trial values.

The one or more parameters may include at least one of current, voltage or temperature related to the battery.

The charging state of the battery may be at least one of a partial charge or a full charge.

The low frequency current signal or the low frequency voltage signal may have a frequency in a range of 1 hertz to 10 hertz.

The low frequency current signal or the low frequency voltage signal may be a square wave including positive values.

BRIEF DESCRIPTION OF THE DIAGRAMS

The above and other aspects, features, and advantages of certain embodiments of the present disclosure will be more apparent from the following description taken in conduction with the accompanying drawings, in which:

FIG. 4 is a block diagram of an exemplary computer system for implementing an embodiment.

DETAILED DESCRIPTION

Figure 1:
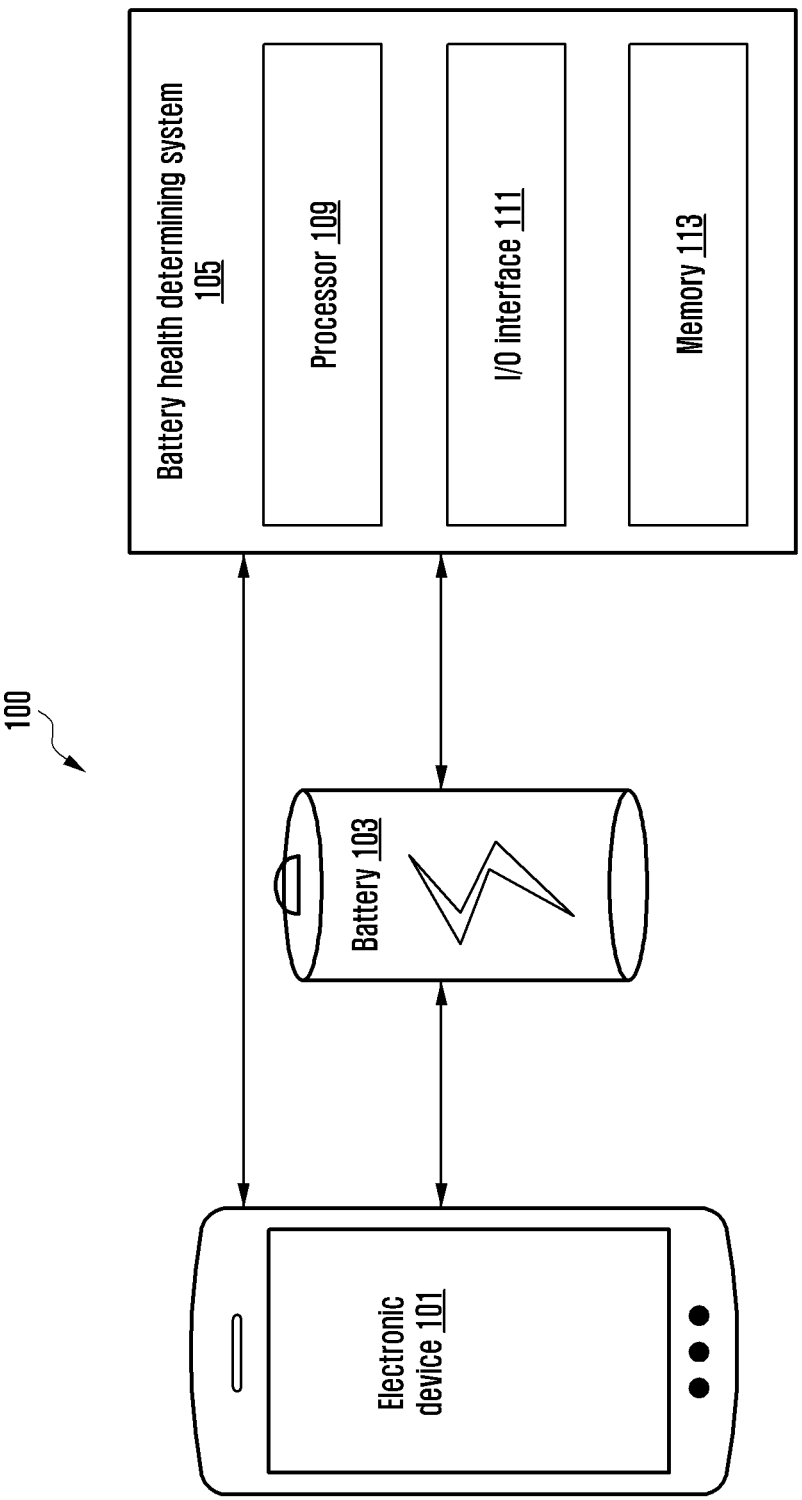
FIG. 1 shows an exemplary architecture for determining State of Health (SOH) of a battery in accordance with an embodiment.

In the present document, the word "exemplary" is used herein to mean "serving as an example, instance, or illustration." Any embodiment or implementation of the present subject matter described herein as "exemplary" is not necessarily to be construed as preferred or advantageous over other embodiments.

While the disclosure is susceptible to various modifications and alternative forms, one or more specific embodiments thereof are shown by way of example in the drawings and are described in detail below. It should be understood, however, that it is not intended to limit the disclosure to the forms illustrated, but on the contrary, the disclosure is to cover all modifications, equivalents, and alternative falling within the scope of the disclosure.

The terms "comprises," "comprising," "includes" or any other variations thereof, are intended to cover a non-exclusive inclusion, such that a setup, device or method that includes a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

Hereinafter, it is understood that expressions such as "at least one of," when preceding a list of elements, modify the entire list of elements and do not modify the individual elements of the list. For example, the expression "at least one of [A], [B], and [C]" means only A, only B, only C, A and B, B and C, A and C, or A, B, and C.

Disclosed herein are a method and a system for determining State of Health (SOH) of a battery. A battery health determining system may be configured to overcome one or more drawbacks in the related art. The battery health determining system may detect a charging state of a battery. The battery may be charged by a Constant Current (CC) or a Constant Voltage (CV). In some embodiments, the charging state of the battery may be a at least one of a partial charge or a full charge. Furthermore, the battery health determining system may add a low frequency current signal or a low frequency voltage signal to the CC or the CV charging the battery to obtain a low frequency charging current and a low frequency charging voltage respectively. Further, the battery health determining system may extract one or more parameters during the charging state of the battery. As an example, the one or more parameters may include, but are not limited to, current, voltage and temperature. Upon determining the one or more parameters, the battery health determining system may estimate an internal impedance and Open Circuit Voltage (OCV) values based on the one or more parameters. For example, the battery health determining system may calculate an internal impedance and Open Circuit Voltage (OCV) values based on the one or more parameters relating to the battery. Further, the battery health determining system may perform a coulomb count for collecting the OCV values when the coulomb count increases by a predefined value. Furthermore, the battery health determining system may determine a delta OCV vector by computing a difference of each of the OCV values with an initial OCV value. The battery health determining system may also determine an average temperature corresponding to the OCV values that were collected by performing the coulomb count. Based on the delta OCV vector and the average temperature thus determined, the battery health determining system may determine SOH of the battery using machine learning model.

One or more embodiments are independent of a State Of Charge (SOC) parameter for determining the SOH of the battery, thereby eliminating the errors that may occur due to choice of initial SOC. Further, one or more embodiments are capable of determining the SOH at a partially charged state of the battery, which eliminates the need to monitor the battery until complete charge or discharge of the battery to determine the SOH. Furthermore, one or more embodiments are compatible with the batteries working on devices with different computational capabilities. One or more embodiments also help in planning maintenance of the device based on the SOH of the battery. For large systems such as EVs and Aircrafts, maintaining reliable battery is extremely crucial. In addition to the above-mentioned benefits, one or more embodiments provide accurate estimation of the SOH, which in turn helps in detecting Internal Short Circuit (ISC) scenarios to prevent subsequent damage caused to the battery and device due to thermal runaway.

A description of an embodiment with several components in communication with each other does not imply that all such components are required. On the contrary, a variety of optional components are described to illustrate the wide variety of possible embodiments.

In the following detailed description, reference is made to the accompanying drawings, in which are shown by way of illustration specific embodiments. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

FIG. 1 shows an exemplary architecture 100 for determining State of Health (SOH) of a battery 103 in accordance with an embodiment.

The architecture 100 includes an electronic device 101, a battery 103 and a battery health determining system 105. The electronic device 101 may be configured with the battery 103 for its operation. In some embodiments, the electronic device 101 may be a mobile device (e.g., a mobile phone, a portable multimedia player, etc.), a laptop, a tablet, an Electronic Vehicle (EV), a wearable device (e.g., a smart watch), and the like, which work based on the battery 103. The battery 103 may be removable from the electronic device 101, and/or the battery 103 may be integrated in the electronic device 101. Further, the battery 103 may be rechargeable. As an example, the battery 103 may include, but is not limited to, a Lithium Ion (Li-ion) battery and a Lithium polymer battery. The battery health determining system 105 may be associated with the electronic device 101 and the battery 103 via a communication network. The communication network may be at least one of a wired communication network and a wireless communication network.

The battery health determining system 105 may include a processor 109 (e.g., at least one processor), an input/output (I/O) interface 111 and a memory 113. The I/O interface 111 may be configured to receive one or more parameters extracted during a charging state of the battery 103. As an example, the one or more parameters may include, but are not limited to, at least one of current, voltage and temperature. According to an embodiment, these parameters may be provided to the battery health determining system 105 by the electronic device 101. The electronic device 101 collects the parameters from the battery 103. The processor 109 may initially detect a charging state of the battery 103. The charging state of the battery 103 may be at least one of a partially charged state (also referred to as partial charge) or a completely charged state (also referred to as full charge). The battery 103 may be charged by a Constant Current (CC) or a Constant Voltage (CV). Further, the processor 109 may add a low frequency current signal to the CC charging the battery 103 to obtain a low frequency charging current or may add a low frequency voltage signal to the CV charging the battery 103 to obtain a low frequency charging voltage. As an example, the low frequency current signal or the low frequency voltage signal may have frequency in a range of 1 hertz to 10 hertz. Hereinbelow, the combination of the CC and the low frequency current signal may be referred as the low frequency charging current and the combination of the CV and the low frequency voltage signal may be referred as the low frequency charging voltage. Further, the processor 109 may extract the one or more parameters during the charging state of the battery 103. Upon determining the one or more parameters, the processor 109 may estimate an internal impedance and Open Circuit Voltage (OCV) values based on the one or more parameters. For example, upon determining the one or more parameters, the battery health determining system may calculate an internal impedance and Open Circuit Voltage (OCV) values based on the one or more parameters relating to the battery 103. Further, the processor 109 may perform a frequency domain estimation to estimate spectral magnitude and phase of the measured current and voltage. Using values of the spectral magnitude and the phase of the measured current and the voltage, the processor 109 may estimate the internal impedance and the OCV values.

Further, the processor 109 may perform a coulomb count for collecting the OCV values when the coulomb count increases by a predefined value. As an example, the predefined value of the coulomb count may be 5%, i.e., the processor 109 may collect the OCV value for every 5% increase in coulomb count from an initial OCV value. Upon collecting the OCV values based on the coulomb count, the processor 109 may determine a delta OCV vector by computing a difference of each of the OCV values with an initial OCV value. Further, the processor 109 may determine an average temperature corresponding to the OCV values. The processor 109 may further determine the State Of Health (SOH) of the battery 103 based on the delta OCV vector and the average temperature using a machine learning model. The machine learning model may be pre-trained using trial values.

Figure 2A:
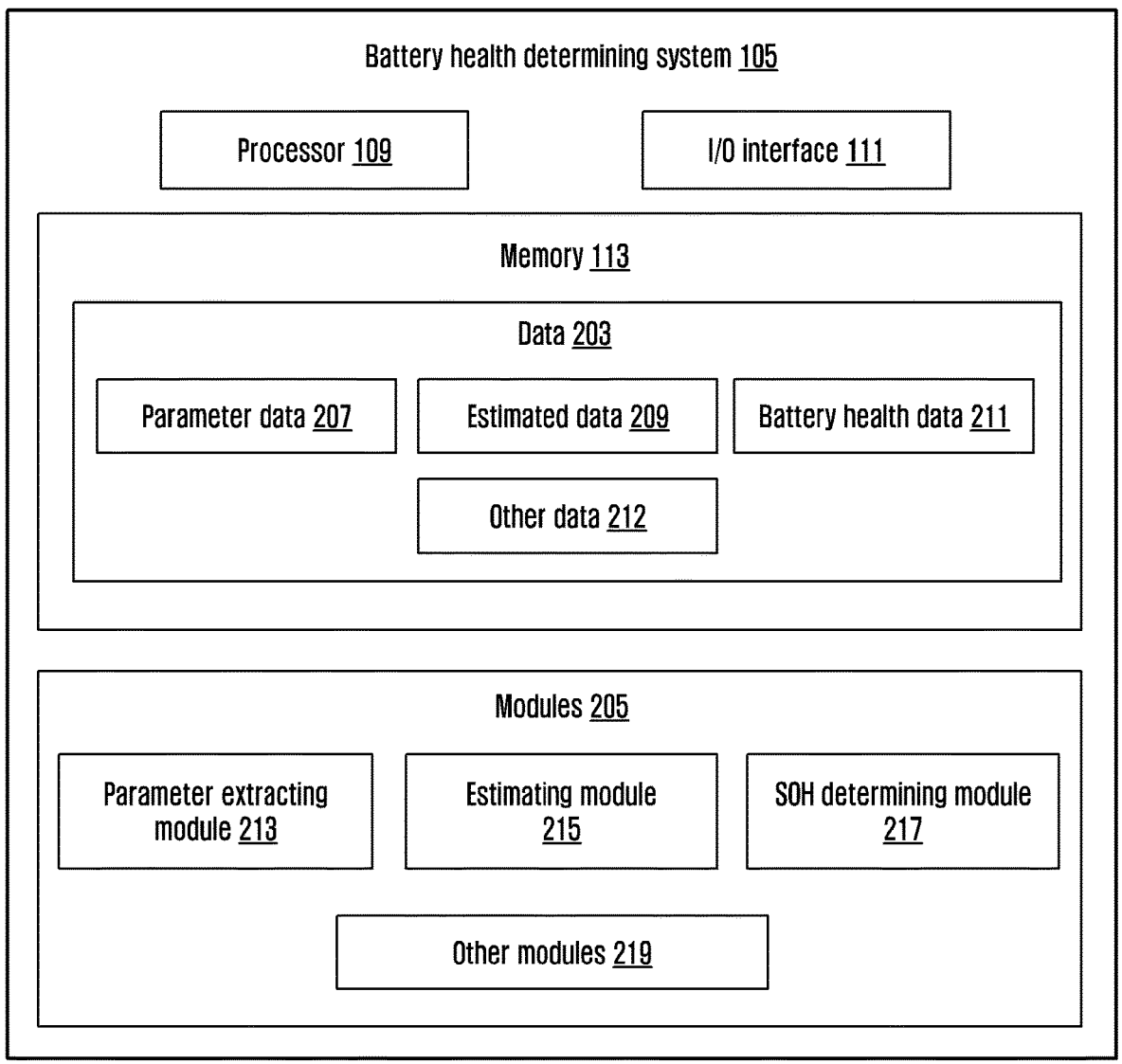
FIG. 2A shows a detailed block diagram of a battery health determining system for determining SOH of a battery in accordance with an embodiment.

FIG. 2A shows a detailed block diagram of a battery health determining system 105 for determining State of Health (SOH) of a battery 103 in accordance with an embodiment.

In some implementations, the battery health determining system 105 may include data 203 and modules 205. As an example, the data 203 is stored in the memory 113 configured in the battery health determining system 105 as shown in the FIG. 2A. The data 203 may include parameter data 207, estimated data 209, battery health data 211 and other data 212.

In various embodiments, the data 203 may be stored in the memory 113 in the form of various data structures. Additionally, the data 203 can be organized using data models, such as relational or hierarchical data models. The other data 212 may store data, including temporary data and temporary files, generated by the modules 205 for performing the various operations of the battery health determining system 105.

The data 203 stored in the memory 113 may be processed by the modules 205 of the battery health determining system 105. The modules 205 may be stored within the memory 113. In an example, the modules 205 communicatively coupled to the processor 109 configured in the battery health determining system 105, may also be present outside the memory 113 as shown in FIG. 2A and implemented as hardware. As used herein, the term module may refer to an application specific integrated circuit (ASIC), an electronic circuit, a processor (shared, dedicated, or group) and memory that execute one or more software or firmware programs, a combinational logic circuit, and/or other suitable components that provide the described functionality.

The modules 205 may include, for example, a parameter extracting module 213, an estimating module 215, a State Of Health (SOH) determining module 217 and other modules 219. The other modules 219 may be used to perform various miscellaneous functionalities of the battery health determining system 105. It will be appreciated that such aforementioned modules 205 may be represented as a single module or a combination of different modules.

The parameter extracting module 213 may initially detect a charging state of the battery 103. The charging state of the battery 103 may be at least one of a partially charged state (also referred to as partial charge) or a completely charged state (also referred to as full charge). The battery 103 may be charged by a Constant Current (CC) or a Constant Voltage (CV). Further, the parameter extracting module 213 may add a low frequency current signal to the CC charging the battery to obtain a low frequency charging current, or may add a low frequency voltage signal to the CV charging the battery to obtain a low frequency charging voltage. As an example, the low frequency current signal or the low frequency voltage signal may have frequency in a range of 1 hertz to 10 hertz. As described above, the combination of the CC and the low frequency current signal may be referred as the low frequency charging current and the combination of the CV and the low frequency voltage signal may be referred as the low frequency charging voltage. Upon adding the low frequency current signal or the low frequency voltage signal, the parameter extracting module 213 may extract the one or more parameters relating to the battery during the charging state of the battery 103. As an example, the one or more parameters may include, but are not limited to, current, voltage and temperature relating to the battery. The one or more parameters extracted may be stored as the parameter data 207. In some embodiments, the charging state of the battery 103 may be at least one of a partially charged state (also referred to as partial charge) or a completely charged state (also referred to as full charge), i.e., the one or more parameters may be extracted when the battery 103 is partially charged or fully charged.

Figure 2B:
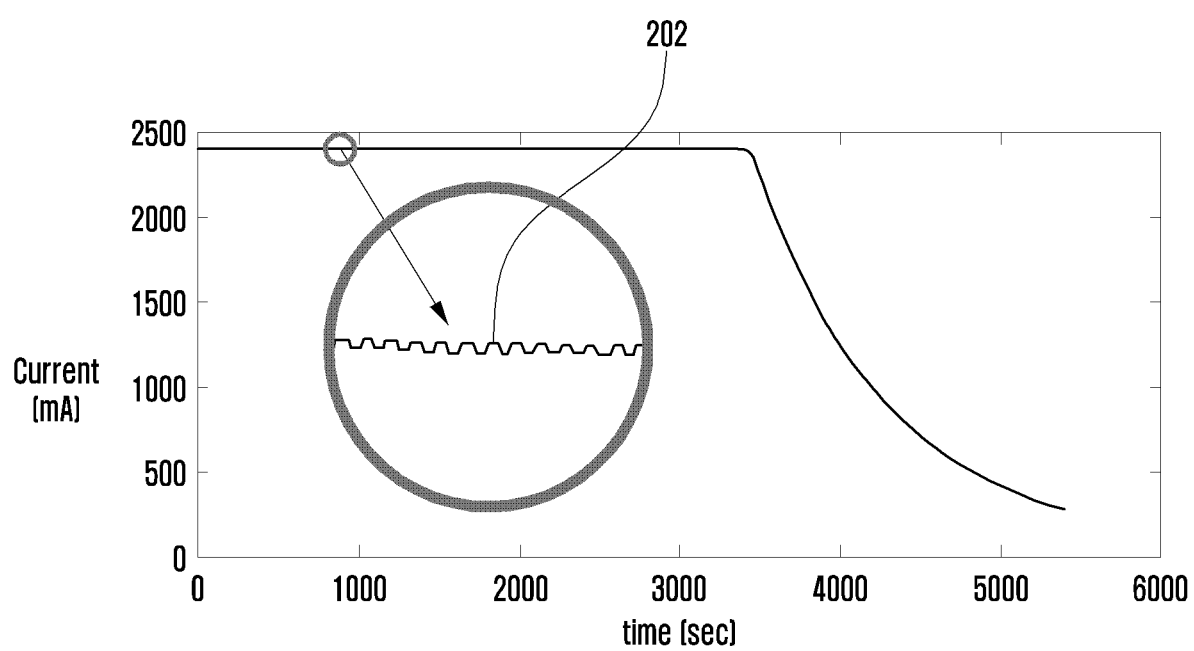
FIG. 2B illustrates an exemplary low frequency current signal in accordance with an embodiment.

In some embodiments, the low frequency current signal or the low frequency voltage signal may be a square wave including positive values. An exemplary low frequency current signal 202 is shown in the FIG. 2B. Further, the parameter extracting module 213 may determine spectral magnitude and phase of the low frequency charging current by performing a frequency domain estimation using the below Equation 1.

$$I(f)=FFT(i) \qquad \text{Equation 1}$$

In the above Equation 1, I(f) indicates magnitude and phase of the low frequency charging current at the frequency f, FFT (i) indicates Fast Fourier Transformation applied to the existing discrete time current values (i), and i is an array of discrete time current values.

Further, the parameter extracting module 213 may determine spectral magnitude and phase of the measured low frequency charging voltage by performing a frequency domain estimation using the below Equation 2.

$$V(f)=FFT(v) \qquad \text{Equation 2}$$

In the above Equation 2, V(f) indicates magnitude and phase of the low frequency charging voltage at the frequency f, and FFT (v) indicates Fast Fourier Transformation applied to the existing array of voltage values indicated by v.

Further, the estimating module 215 may estimate an internal impedance and Open Circuit Voltage (OCV) values based on the one or more parameters. For example, the estimating module 215 may calculate an internal impedance and Open Circuit Voltage values based on the one or more parameters. The internal impedance and the OCV values may be stored as the estimated data 209. The estimating module 215 may estimate the internal impedance based on the spectral magnitude and the phase of the measured low frequency charging current and the voltage. In some embodiments, the estimating module 215 may estimate internal impedance at the low frequency using the below Equation 3.

$$R_i(f)=V(f)/I(f) \qquad \text{Equation 3}$$

In the above Equation 3, f indicates the fundamental frequency value of the square wave which may be between 1 Hz to 10 Hz, $R_i(f)$ indicates internal impedance at the frequency f, I(f) indicates magnitude and phase of the low frequency charging current at the frequency f, and V(f) indicates magnitude and phase of the low frequency charging voltage at the frequency f.

Further, the estimating module 215 may estimate the OCV values based on the spectral magnitude and the phase of the low frequency charging current and the low frequency charging voltage. In some embodiments, the internal impedance calculated using Equation 3 may also be used to calculate the OCV values. The estimating module 215 may calculate the OCV values at a plurality of time instances using, but not limited to, Kirchhoffs Voltage Law (KVL).

Upon estimating the internal impedance and the OCV values at a plurality of time instances, the SOH determining module 217 may determine the OCV values at a plurality of time instances where coulomb count increases by a pre-defined value. As an example, a coulomb count may be performed starting from an initial OCV value, for a plurality of time instances using the below Equation 4.

$$\int \frac{idt}{C_{max}}(k_1) = \frac{\sum_{k=k_0}^{k=k_1} i(k)T_s}{C_{max}} \times 100\%$$ Equation 4

In the above Equation 4, $$\int \frac{idt}{C_{max}}(k_1)$$

indicates coulomb count between $k_0$ and $k_1$ instances, $k_0$ and $k_1$ indicate two time instances, $i(k)$ indicates current at time instance k, $T_s$ indicates sampling time, and $C_{max}$ indicates maximum capacity of the battery 103.

The above Equation 4 provides coulomb count, i.e., measures charge entering and leaving the battery 103 by computing summation of current multiplied by sampling time. In some embodiments, the coulomb count starts from an initial OCV value. As an example, the initial OCV value may be 3.7V.

Figure 2C:
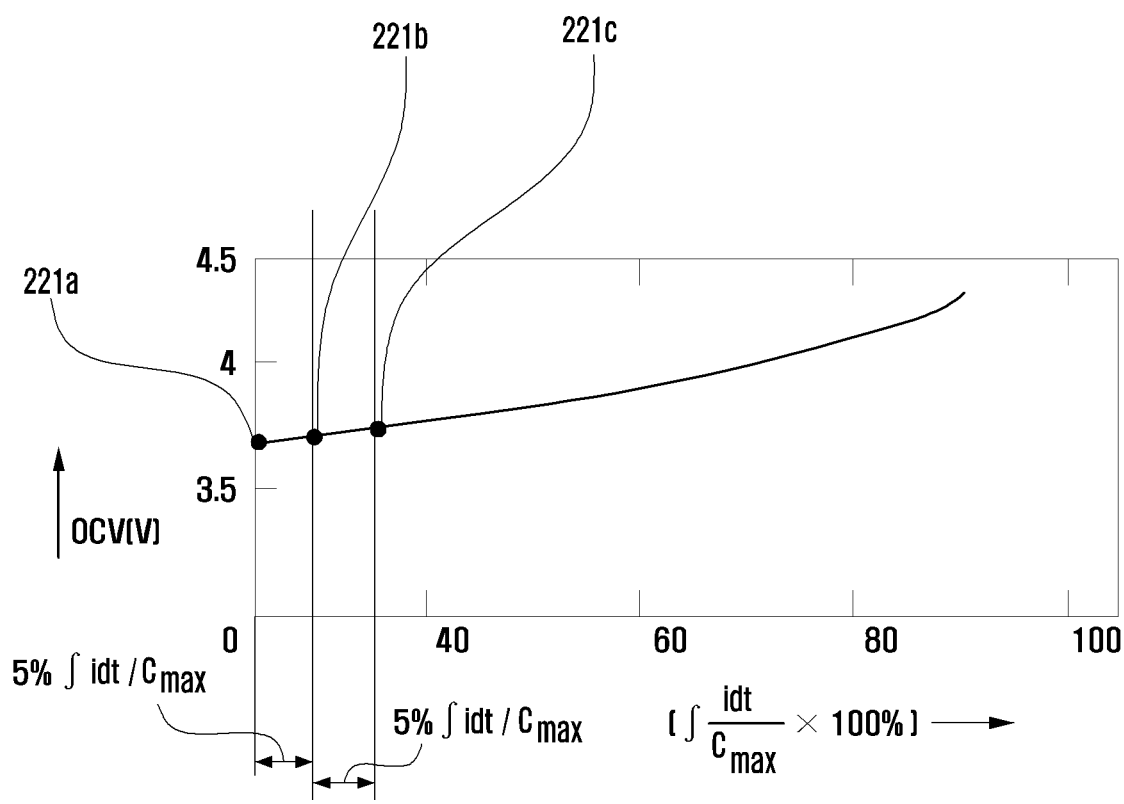
FIG. 2C shows a graph representing OCV values and coulomb count in accordance with an embodiment.

The SOH determining module 217 may determine coulomb count for a plurality of time instances. The SOH determining module 217 may determine the plurality of time instances at which the coulomb count increases by the predefined value. As an example, the predefined value may be 5%. Therefore, whenever the SOH determining module 217 determines a 5% increase in the coulomb count, the SOH determining module 217 may collect the OCV value. FIG. 2C shows a graph representing OCV values along the Y-axis and coulomb count $$\left(\int \frac{idt}{C_{max}} \times 100\%\right)$$

along the X-axis. As shown in FIG. 2C, an exemplary initial OCV value determined at time instance $k_0$, which is indicated as 221a, may be 3.7V. Further, at time instance $k_1$, a 5% increase in coulomb count is observed compared to the coulomb count at the time instance $k_0$. Therefore, the OCV value corresponding to the time instance $k_1$, which is indicated as 221b, may be collected. Similarly, at time instance $k_2$, a 5% increase in coulomb count is observed compared to the coulomb count at the time instance $k_1$. Therefore, the OCV value corresponding to the time instance $k_2$, which is indicated as 221c, may be collected. Similarly, the OCV values may be collected for a plurality of time instances when the 5% increase in coulomb count is determined.

Further, the SOH determining module 217 may determine delta OCV vector using the OCV values collected at the plurality of time instances. In some embodiments, the delta OCV vector may be determined by computing a difference of the determined OCV values with the initial OCV value. Referring to the above example, where the OCV values are determined at $k_0$, $k_1$ and $k_2$ time instances, the SOH determining module 217 may compute the difference using the below Equation 5.

$$\Delta OCV(n) = OCV(k_n) - OCV(k_0)$$ Equation 5

Where n=1,2, . . . ,N. N may be 9.
As an example, $$\Delta OCV(1) = OCV(k_1) - OCV(k_0) = 3.78 - 3.7 = 0.08V$$

Upon determining delta OCV values for each of the collected OCV values, the SOH determining module 217 may determine a delta OCV vector, i.e., a vector of delta OCV values by using each of the delta OCV values.

Further, the SOH determining module 217 may determine average temperature using temperature values determined at the plurality of time instances corresponding to the determined OCV values. The temperature values may be determined using temperature sensors associated with the battery 103 or using any other temperature determining mechanisms.

Finally, the SOH determining module 217 may provide the delta OCV vector and the average temperature as an input to a machine learning model to determine SOH of the battery 103 as shown in the below Equation 6.

$$SOH \text{ of the battery } 103 = f(\Delta OCV, T_{batt})$$ Equation 6

In the above Equation 6, $T_{batt}$ indicates average temperature, $\Delta OCV$ indicates delta OCV vector; and f indicates a function of the machine learning model.

Figure 2D:
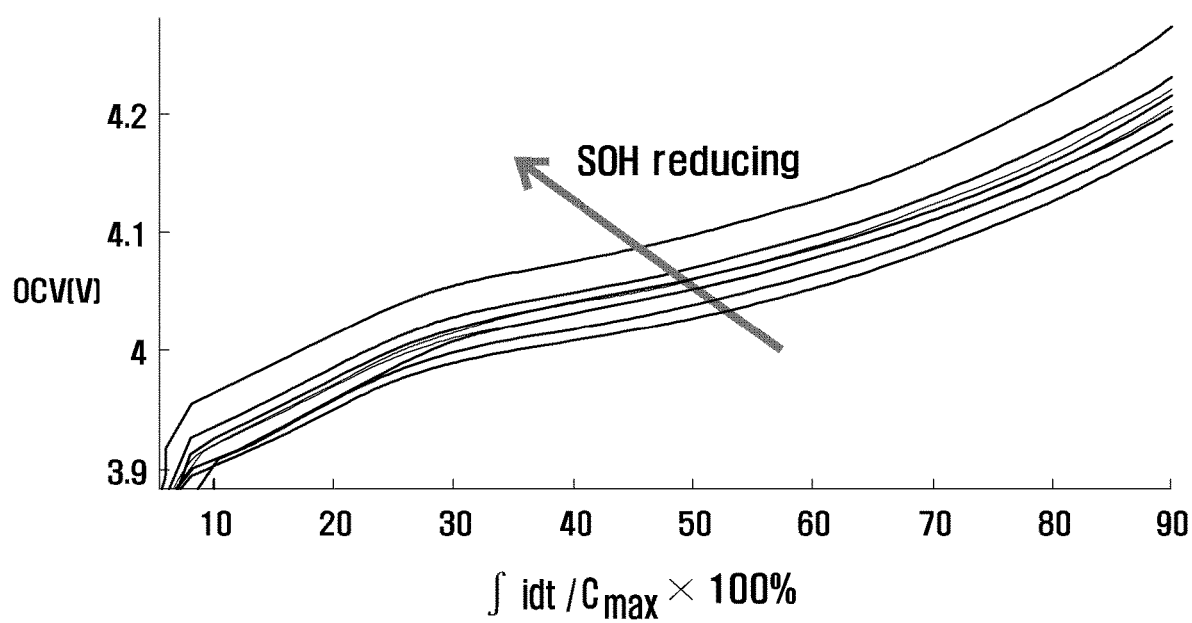
FIG. 2D shows an exemplary graph indicating decrease in SOH of the battery over a period of time in accordance with an embodiment.

By way of example, the SOH of the battery 103 may be a percentage value. Further, as an example, the machine learning model may be an Artificial Neural Network (ANN). In some embodiments, the machine learning model may be pre-trained based on trial values of the one or more parameters, delta OCV vectors, average temperature and the like. Further, the machine learning model may first be trained using a training dataset and subsequently tested using a testing dataset. Values corresponding to at least one of the coulomb count, delta OCV vector, average temperature and SOH of the battery 103 may be stored as the battery health data 211. FIG. 2D shows a graph with OCV values along the Y-axis and coulomb count $$\left(\int \frac{idt}{C_{max}} \times 100\%\right)$$

along the X-axis, that indicates decrease in SOH and change in OCV curves of the battery 103 over a period of time.

Figure 3:
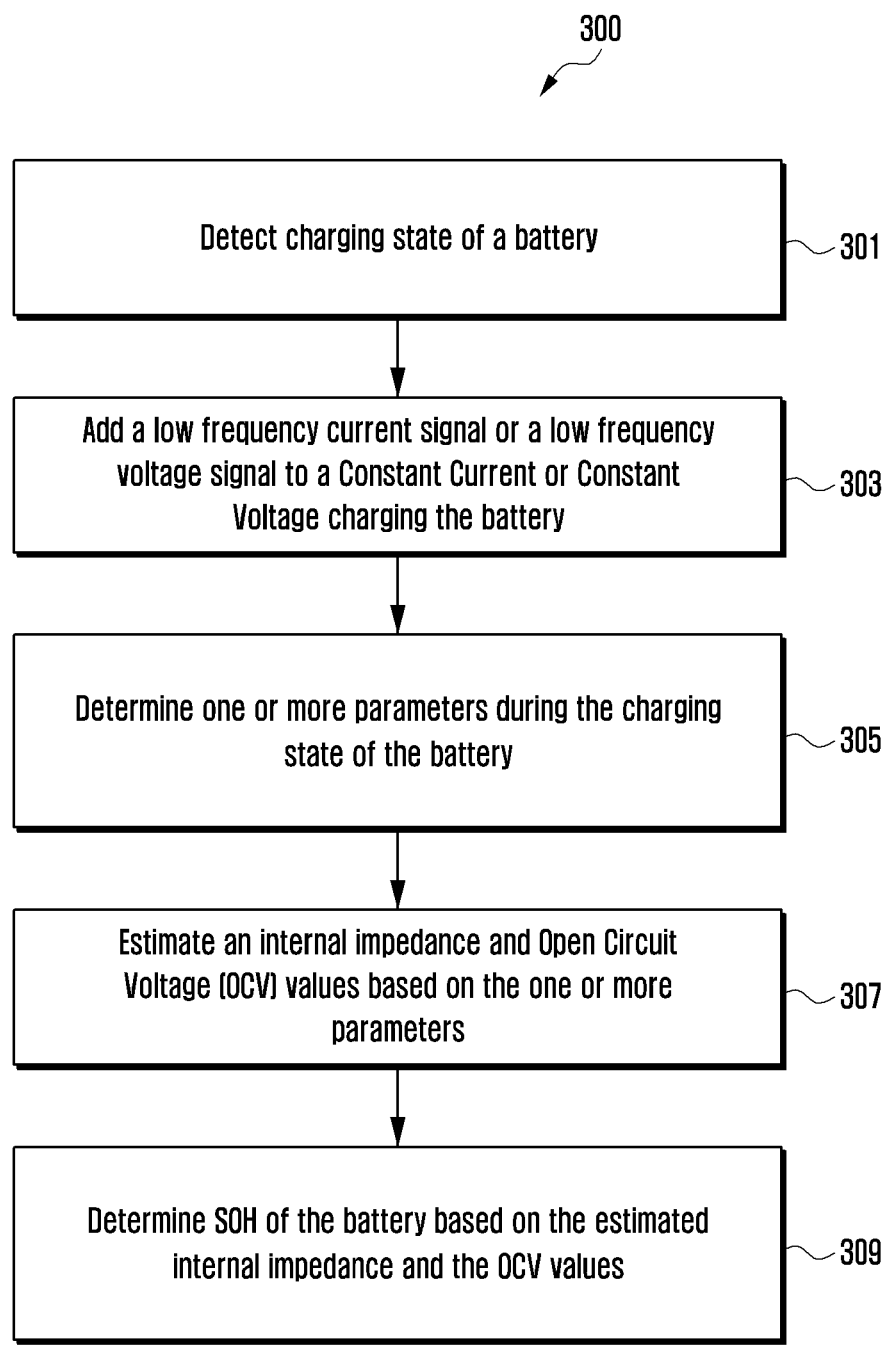
FIG. 3 shows a flowchart illustrating a method of determining SOH of a battery in accordance with an embodiment.

FIG. 3 shows a flowchart illustrating a method 300 of determining State of health (SOH) of a battery in accordance with an embodiment.

As illustrated in FIG. 3, the method 300 includes one or more blocks illustrating a method of determining State of Health (SOH) of a battery. The method 300 may be described in the general context of computer-executable instructions. Generally, computer-executable instructions can include at least one of routines, programs, objects, components, data structures, procedures, modules, and functions, which perform functions or implement abstract data types.

The order in which the method 300 is described is not intended to be construed as a limitation, and any number of the described method blocks can be combined in any order to implement the method 300. Additionally, individual blocks may be deleted from the methods without departing from the spirit and scope of the subject matter described herein. Furthermore, the method 300 can be implemented in any suitable hardware, software, firmware, or combination thereof.

At block 301, the method 300 may include detecting, by a processor 109 configured in a battery health determining system 105, a charging state of a battery 103. The charging state of the battery 103 may be at least one of a partially charged state (also referred to as partial charge) or a completely charged state (also referred to as full charge). The battery 103 may be charged by a Constant Current (CC) or a Constant Voltage (CV).

At block 303, the method 300 may include adding, by the processor 109, at least one of a low frequency current signal to the CC charging the battery 103 to obtain a low frequency charging current or a low frequency voltage signal to the CV charging the battery 103 to obtain a low frequency charging voltage.

At block 305, the method 300 may include extracting, by the processor 109, one or more parameters relating to the battery 103 during a charging state of the battery. The one or more parameters may include, but are not limited to, current, voltage and/or temperature.

At block 307, the method 300 may include estimating, by the processor 109, an internal impedance and Open Circuit Voltage (OCV) values based on the one or more parameters. For example, the method 300 may include calculating, by the processor 109, an internal impedance and Open Circuit Voltage (OCV) values based on the one or more parameters relating to the battery 103

At block 309, the method 300 may include determining, by the processor 109, SOH of the battery 103 based on the calculated internal impedance, the OCV values and average temperature of the battery 103 using a machine learning model that may be pre-trained using trial values. In some embodiments, the processor 109 may start a coulomb count from an initial OCV value for a plurality of time instances and collect the OCV values at a plurality of time instances for which the coulomb count increases by a predefined value. Upon collecting the OCV values, the processor 109 may determine a delta OCV vector using the OCV values and also may determine an average temperature corresponding to the OCV values. Further, based on the delta OCV vector and the average temperature, the processor 109 may determine the SOH of the battery 103.

FIG. 4 is a block diagram of an exemplary computer system 400 for implementing one or more embodiments.

Referring to FIG. 4, the computer system 400 can be a battery health determining system 105 that is used for determining State of Health (SOH) of a battery 103. The computer system 400 may include a central processing unit ("CPU" or "processor") 402. The processor 402 may include at least one data processor for executing program components for executing user or system-generated business processes. A user may include a person, a person using a device such as such as those described above, or such a device itself. The processor 402 may include specialized processing units such as integrated system (bus) controllers, memory management control units, floating point units, graphics processing units, digital signal processing units, etc.

The processor 402 may be in communication with input devices 411 and output devices 412 via an I/O interface 401. The I/O interface 401 may employ communication protocols/methods such as, without limitation, audio, analog, digital, stereo, IEEE-1394, serial bus, Universal Serial Bus (USB), infrared, PS/2, BNC, coaxial, component, composite, Digital Visual Interface (DVI), high-definition multimedia interface (HDMI), Radio Frequency (RF) antennas, S-Video, Video Graphics Array (VGA), IEEE 802.n/b/g/n/x, Bluetooth, cellular (e.g., Code-Division Multiple Access (CDMA), High-Speed Packet Access (HSPA+), Global System For Mobile Communications (GSM), Long-Term Evolution (LTE), WiMax, or the like), etc.

Using the I/O interface 401, the computer system 400 may communicate with input devices 411 and output devices 412.

The processor 402 may be in communication with a communication network 409 via a network interface 403. The network interface 403 may communicate with the communication network 409. The network interface 403 may employ connection protocols including, without limitation, direct connect, Ethernet (e.g., twisted pair 10/100/1000 Base T), Transmission Control Protocol/Internet Protocol (TCP/IP), token ring, IEEE 802.11a/b/g/n/x, etc. Using the network interface 403 and the communication network 409, the computer system 400 may communicate with an electronic device 101 and a battery 103. The communication network 409 can be implemented as one of the different types of networks, such as intranet or Local Area Network (LAN) and such within the organization. The communication network 409 may either be a dedicated network or a shared network, which represents an association of the different types of networks that use a variety of protocols, for example, Hypertext Transfer Protocol (HTTP), Transmission Control Protocol/Internet Protocol (TCP/IP), Wireless Application Protocol (WAP), etc., to communicate with each other. Further, the communication network 409 may include a variety of network devices, including routers, bridges, servers, computing devices, storage devices, etc. The electronic device 101 may include, but is not limited to, a mobile device (such as a mobile phone, a portable multimedia player, etc.), a smart wearable device, a laptop, a tablet, and an Electronic Vehicle (EV), which work based on the battery 103. The processor 402 may be in communication with a memory 405 (e.g., RAM, ROM, etc.) via a storage interface 404. The storage interface 404 may connect to memory 405 including, without limitation, memory drives, removable disc drives, etc., employing connection protocols such as Serial Advanced Technology Attachment (SATA), Integrated Drive Electronics (IDE), IEEE-1394, Universal Serial Bus (USB), fibre channel, Small Computer Systems Interface (SCSI), etc. The memory drives may further include a drum, magnetic disc drive, magneto-optical drive, optical drive, Redundant Array of Independent Discs (RAID), solid-state memory devices, solid-state drives, etc.

The memory 405 may store a collection of program or database components, including, without limitation, a user interface 406, an operating system 407, a web browser 408 etc. In some embodiments, the computer system 400 may store user/application data, such as the data, variables, records, etc. as described in this invention. Such databases may be implemented as fault-tolerant, relational, scalable, secure databases such as Oracle or Sybase.

Operating system 407 may facilitate resource management and operation of the computer system 400. Examples of operating systems include, without limitation, APPLE® MACINTOSH® OS X®, UNIX®, UNIX-like system distributions (e.g., BERKELEY SOFTWARE DISTRIBUTION® (BSD), FREEBSD®, NETBSD®, OPENBSD, etc.), LINUX® DISTRIBUTIONS (E.G., RED HAT®, UBUNTU®, KUBUNTU®, etc.), IBM® OS/2®, MICROSOFT® WINDOWS® (XP®, VISTA®/7/8, etc.), APPLE® IOS®, GOOGLE™ ANDROID™, BLACKBERRY® OS, or the like. The user interface 406 may facilitate display, execution, interaction, manipulation, or operation of program components through textual or graphical facilities. For example, user interfaces may provide computer interaction interface elements on a display system operatively connected to computer system 400, such as cursors, icons, check boxes, menus, scrollers, windows, widgets, etc. Graphical User Interfaces (GUIs) may be employed, including, without limitation, APPLE® MACINTOSH® operating systems' AQUA®, IBM® OS/2®, MICROSOFT® WINDOWS® (e.g., Aero, Metro, etc.), web interface libraries (e.g., ACTIVEX®, JAVA®, JAVASCRIPT®, AJAX, HTML, ADOBE® FLASH®, etc.), or the like.

Computer system 400 may implement web browser 408 stored program components. The web browser 408 may be a hypertext viewing application, such as MICROSOFT® INTERNET EXPLORER®, GOOGLE™ CHROME™, MOZILLA® FIREFOX®, APPLE® SAFARI etc. Secure web browsing may be provided using Secure Hypertext Transport Protocol (HTTPS), Secure Sockets Layer (SSL), Transport Layer Security (TLS), etc. Web browsers 408 may utilize facilities such as AJAX, DHTML, ADOBE® FLASH®, JAVASCRIPT®, JAVA®, Application Programming Interfaces (APIs), etc. The computer system 400 may implement a mail server stored program component. The mail server may be an Internet mail server such as MICROSOFT EXCHANGE, or the like. The mail server may utilize facilities such as ASP, ACTIVEX®, ANSI® C++/C#, MICROSOFT®, .NET, CGI SCRIPTS, JAVA®, JAVASCRIPT®, PERL®, PHP, PYTHON®, WEBOBJECTS®, etc. The mail server may utilize communication protocols such as Internet Message Access Protocol (IMAP), Messaging Application Programming Interface (MAPI), MICROSOFT® exchange, Post Office Protocol (POP), Simple Mail Transfer Protocol (SMTP), or the like. In some embodiments, the computer system 400 may implement a mail client stored program component. The mail client may be a mail viewing application, such as APPLE® MAIL, MICROSOFT® ENTOURAGE®, MICROSOFT® OUTLOOK®, MOZILLA® THUNDERBIRD®, etc.

Furthermore, one or more computer-readable storage media may be utilized in implementing one or more embodiments. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with one or more embodiments described herein. The term "computer-readable medium" should be understood to include tangible items and exclude carrier waves and transient signals, i.e., non-transitory. Examples include Random Access Memory (RAM), Read-Only Memory (ROM), volatile memory, non-volatile memory, hard drives, Compact Disc (CD) ROMs, Digital Video Disc (DVDs), flash drives, disks, and any other known physical storage media.

A description of an embodiment with several components in communication with each other does not imply that all such components are required. On the contrary, a variety of optional components are described to illustrate the wide variety of possible embodiments. When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article or a different number of devices/articles may be used instead of the shown number of devices or programs. The functionality and/or the features of a device may be alternatively embodied by one or more other devices that are not explicitly described as having such functionality/features. Thus, other embodiments need not include the device itself.

The specification has described a method and a system for determining State of Health (SOH) of a battery. The illustrated steps are set out to explain the exemplary embodiments shown, and it should be anticipated that on-going technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments. Also, the words "comprising," "having," "containing," and "including," and other similar forms are intended to be equivalent in meaning and be open-ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Finally, the language used in the specification has been principally selected for readability and instructional purposes, and it may not have been selected to delineate or circumscribe the inventive subject matter. It is therefore intended that the scope of the invention be limited not by this detailed description, but rather by at least any claims that issue on an application based here on. Accordingly, described embodiments are intended to be illustrative, but not limiting, of the scope of the invention, which is set forth at least in the following claims.

What is claimed is:

1. A method for determining State of Health (SOH) of a battery, the method comprising:
   detecting a charging state of the battery that is being charged by a Constant Current (CC) or a Constant Voltage (CV);
   adding a low frequency current signal to the CC that is charging the battery to obtain a low frequency charging current, or adding a low frequency voltage signal to the CV, that is charging the battery to obtain a low frequency charging voltage;
   determining one or more parameters relating to the battery during the charging state of the battery;
   calculating an internal impedance and Open Circuit Voltage (OCV) values based on the one or more parameters; and determining the SOH of the battery based on the calculated internal impedance and the OCV values, wherein the determining the SOH of the battery comprises:

performing a coulomb count for collecting the OCV values at a plurality of time instances where the coulomb count increases by a predefined value, wherein the coulomb count starts from an initial OCV value, for the plurality of time instances;

determining a delta OCV vector by computing a difference of each of the OCV values with the initial OCV value, and an average temperature corresponding to the OCV values; and determining the SOH of the battery based on the delta OCV vector and the average temperature using a machine learning model that is pre-trained using trial values.

2. The method as claimed in claim 1, wherein the calculating the internal impedance and the OCV values comprises:

determining a spectral magnitude and a phase of the low frequency charging current or the low frequency charging voltage by performing a frequency domain estimation; and calculating the internal impedance and the OCV values based on the spectral magnitude and the phase of the low frequency charging current or the low frequency charging voltage.

3. The method as claimed in claim 1, wherein the one or more parameters comprise at least one of current, voltage or temperature related to the battery.

4. The method as claimed in claim 1, wherein the charging state of the battery is at least one of a partial charge or a full charge.

5. The method as claimed in claim 1, wherein the low frequency current signal or the low frequency voltage signal has a frequency in a range of 1 hertz to 10 hertz.

6. The method as claimed in claim 1, wherein the low frequency current signal or the low frequency voltage signal is a square wave comprising positive values.

7. A battery health determining system for determining State of Health (SOH) of a battery, the battery health determining system comprising:

a processor; and a memory communicatively coupled to the processor, wherein the memory stores processor-executable instructions that, when executed by the processor, causes the processor to:

detect a charging state of the battery that is being charged by a Constant Current (CC) or a Constant Voltage (CV);

add a low frequency current signal to the CC that is charging the battery to obtain a low frequency charging current, or add a low frequency voltage signal to the CV charging the battery to obtain a low frequency charging voltage;

determine one or more parameters relating to the battery during the charging state of the battery;

calculate an internal impedance and Open Circuit Voltage (OCV) values based on the one or more parameters; and determine the SOH of the battery based on the calculated internal impedance and the OCV values, wherein the processor-executable instructions, when executed by the processor, further cause the processor to:

perform a coulomb count for collecting the OCV values at a plurality of time instances where the coulomb count increases by a predefined value, wherein the coulomb count starts from the initial OCV value, for the plurality of time instances;

determine a delta OCV vector by computing a difference of each of the OCV values with the initial OCV value, and an average temperature corresponding to the OCV values; and determine the SOH of the battery based on the delta OCV vector and the average temperature using a machine learning model that is pre-trained using trial values.

8. The battery health determining system as claimed in claim 7, wherein the processor-executable instructions, when executed by the processor, further cause the processor to:

determine a spectral magnitude and a phase of the low frequency charging current or the low frequency charging voltage by performing a frequency domain estimation; and calculate the internal impedance and the OCV values based on the spectral magnitude and the phase of the low frequency charging current or the low frequency charging voltage.

9. The battery health determining system as claimed in claim 7, wherein the one or more parameters comprise at least one of current, voltage or temperature related to the battery.

10. The battery health determining system as claimed in claim 7, wherein the charging state of the battery is at least one of a partial charge or a full charge.

11. The battery health determining system as claimed in claim 7, wherein the low frequency current signal or the low frequency voltage signal has a frequency in a range of 1 hertz to 10 hertz.

12. The battery health determining system as claimed in claim 7, wherein the low frequency current signal or the low frequency voltage signal is a square wave comprising positive values.

13. A non-transitory computer-readable recording medium having recorded thereon instructions executable by a processor to perform a method for determining State of Health (SOH) of a battery, the method comprising:

detecting a charging state of the battery that is being charged by a Constant Current (CC) or a Constant Voltage (CV);

adding a low frequency current signal to the CC that is charging the battery to obtain a low frequency charging current, or adding a low frequency voltage signal to the CV, that is charging the battery to obtain a low frequency charging voltage;

determining one or more parameters relating to the battery during the charging state of the battery;

calculating an internal impedance and Open Circuit Voltage (OCV) values based on the one or more parameters; and determining the SOH of the battery based on the calculated internal impedance and the OCV values, wherein the determining the SOH of the battery comprises:

performing a coulomb count for collecting the OCV values at a plurality of time instances where the coulomb count increases by a predefined value, wherein the coulomb count starts from an initial OCV value, for the plurality of time instances;

determining a delta OCV vector by computing a difference of each of the OCV values with the initial OCV value, and an average temperature corresponding to the OCV values; and determining the SOH of the battery based on the delta OCV vector and the average temperature using a machine learning model that is pre-trained using trial values.

14. The non-transitory computer-readable recording medium as claimed in claim 13, wherein the calculating the internal impedance and the OCV values comprises:

determining a spectral magnitude and a phase of the low frequency charging current or the low frequency charging voltage by performing a frequency domain estimation; and calculating the internal impedance and the OCV values based on the spectral magnitude and the phase of the low frequency charging current or the low frequency charging voltage.

15. The non-transitory computer-readable recording medium as claimed in claim 13, wherein the one or more parameters comprise at least one of current, voltage or temperature related to the battery.

16. The non-transitory computer-readable recording medium as claimed in claim 13, wherein the charging state of the battery is at least one of a partial charge or a full charge.

17. The non-transitory computer-readable recording medium as claimed in claim 13, wherein the low frequency current signal or the low frequency voltage signal is a square wave comprising positive values.

* * * * *